United States Patent [19]

Hale

[11] E Patent Number: Re. 32,110

[45] Reissued Date of Patent: Apr. 15, 1986

[54] ALUMINUM OXIDE COATED CEMENTED CARBIDE PRODUCT

[75] Inventor: Thomas E. Hale, Warren, Mich.

[73] Assignee: General Electric Co., New York, N.Y.

[21] Appl. No.: 577,584

[22] Filed: May 15, 1975

Related U.S. Patent Documents

Reissue of:

[64] Patent No.: 3,736,107
Issued: May 29, 1973
Appl. No.: 147,240
Filed: May 26, 1971

[51] Int. Cl.[4] ..... B32B 9/04

[52] U.S. Cl. ..... 428/336; 427/255; 427/248.1; 428/539.5; 428/926; 428/936

[58] Field of Search ..... 427/226, 248 A, 248 B, 427/255; 428/538, 539, 924, 926, 932, 936, 552, 457, 335; 29/182.7

[56] References Cited

U.S. PATENT DOCUMENTS

| | | | |
|---|---|---|---|
| 2,707,691 | 5/1955 | Wheildon . | |
| 3,031,331 | 1/1962 | Aves et al. . | |
| 3,054,694 | 9/1962 | Aves . | |
| 3,110,571 | 11/1963 | Alexander et al. | 428/564 |
| 3,178,308 | 4/1965 | Oxley et al. . | |
| 3,196,056 | 7/1965 | Ornitz . | |
| 3,251,337 | 5/1966 | Latta et al. . | |
| 3,261,673 | 7/1966 | Wheildon . | |
| 3,502,493 | 3/1970 | Forestek . | |
| 3,565,643 | 2/1971 | Bergna | 106/43 |
| 3,640,689 | 2/1972 | Glaski et al. . | |
| 3,640,757 | 2/1972 | Grubba . | |
| 3,642,522 | 2/1972 | Gass et al. . | |
| 3,656,229 | 4/1972 | Sakurai et al. . | |
| 3,696,707 | 10/1972 | Schedler et al. . | |
| 3,713,882 | 1/1973 | Debrunner et al. . | |
| 3,752,655 | 8/1973 | Ramqvist . | |
| 3,770,512 | 11/1973 | Bopp | 427/252 |
| 3,836,392 | 9/1974 | Lux et al. | 148/6.3 |

FOREIGN PATENT DOCUMENTS

| | | |
|---|---|---|
| 268003 | 1/1969 | Austria . |
| 547937 | 6/1956 | Belgium . |
| 600374 | 7/1934 | Fed. Rep. of Germany . |
| 895084 | 2/1953 | Fed. Rep. of Germany . |
| 2018662 | 12/1970 | Fed. Rep. of Germany . |
| 70-7379 | 5/1970 | Sweden . |
| 330470 | 11/1970 | Sweden . |
| 819086 | 8/1959 | United Kingdom . |

OTHER PUBLICATIONS

Lee, et al., "The Effect of a Coated . . . Tools", Society of Manuf. Engr. CMEP (1971).

Hinterman & Gass, "Chemical Deposition from the Gaseous Phase", Schweizer Archiv. pp. 157-163 (1967).

McCandless, et al., "Chemically Vapor Deposited Ceramic Coatings . . . Oxides", J. Electromechanical Socy. (Mar. 1970).

Opitz, et al., "Oxides Make Steels Supermachineable", Machining (Apr., 1968).

Powell, et al., "Vapor Deposition", Electrochemical Socy, Inc. pp. 384-389; 493-396 (1966).

Powell, et al., "Vapor-Plating", Electrochemical Society, Inc. (1955) pp. 136-143.

Wong, et al., "Chemical Vapor Deposition . . . $Al_2O_3$", J. Amer. Ceram, Soc. 53[11] 617-21 (1970).

Parker, et al, "Vapor Growth of $Al_2O_3$ Bicrystals", J. Amer. Ceram. Soc. 53[11] 583-85 (1970).

P. S. Schaffer, "Vapor-Phase Growth of Alpha Alumina Single Crystals", J. Amer. Ceram. Soc., 48[10] 508-11 (1965).

Campbell, et al, "Vapor-Phase . . . Materials", J. of The Electrochemical Soc., vol. 96, No. 5 (Jun. 1949) pp. 318-333.

*Primary Examiner*—Jerome Massie

[57] ABSTRACT

A high-strength, coated cemented carbide product comprising a cemented carbide substrate and a fully dense alpha aluminum oxide coating on the substrate. The coating has a thickness of from 1-20 microns and is firmly and adherently bonded to the cemented carbide substrate through a thin intermediate nonmetallic layer [of an iron group metal aluminate]. The coated product combines a wear resistance substantially as high as aluminum oxide cutting materials and a transverse rupture strength of at least 150,000 p.s.i. The coated product is prepared by passing water vapor, hydrogen gas and an aluminum halide over the substrate at a temperature of from 900°-1250° C., the ratio of water vapor to hydrogen gas being between about 0.025 and 2.0.

3 Claims, No Drawings

ALUMINUM OXIDE COATED CEMENTED CARBIDE PRODUCT

Matter enclosed in heavy brackets [ ] appears in the original patent but forms no part of this reissue specification; matter printed in italics indicates the additions made by reissue.

BACKGROUND OF THE INVENTION

This invention relates to a high-strength, coated cemented carbide product and to a process for its preparation.

Cemented carbides are well known for their unique combination of hardness, strength and wear resistance and are accordingly extensively used for such industrial applications as cutting tools, drawing dies and wear parts. It is known that the wear resistance of cemented carbides may be enhanced by the application of a thin coating of a highly wear-resistant material, such as, for example, titanium carbide, and such coated cemented carbides are finding increasing commercial utility for certain cutting tool and machining applications. However, the increased wear resistance of such coated products has been at the sacrifice of the strength of the substrate which is substantially reduced after coating.

Because of its high hardness, wear resistance and low reactivity with a wide variety of metals, aluminum oxide has excellent potential as a tool material, and this potential has to some extent been realized with a variety of aluminum oxide cutting materials that are commercially available. The principal drawback to the more widespread use of aluminum oxide tools in their low strength which rarely exceeds 100,000 p.s.i., using the standard transverse rupture or bend test. This compares with a strength of from 200,000 to 300,000, or even more, for cemented carbide cutting tools. The low strength of aluminum oxide tools limits their use to cutting applications where the tool is not highly stressed, such as in finishing cuts. The low strength of aluminum oxide also precludes the use of such materials in certain types of insert shapes which encounter high stresses when locked in a toolholder.

It is an object of this invention to provide a hard, wear-resistant material which combines the extremely high wear resistance of aluminum oxide with the relatively high strength and hardness of cemented carbide.

It is an additional object of this invention to improve the wear resistance of cemented carbides without substantially reducing their strength. It is still an additional object of this invention to provide a process for producing a firmly adherent, nonporous, dense coating of aluminum oxide on a cemented carbide substrate.

SUMMARY OF THE INVENTION

The foregoing and other objects of this invention are achieved by the vapor deposition under carefully controlled conditions of an alpha aluminum oxide coating of from 1–20 microns thickness on a cemented carbide substrate. The product contains a cemented carbide substrate and a fully dense alpha aluminum oxide coating firmly and adherently bonded to the substrate. In addition, there is present a very thin, intermediate nonmetallic layer [of cobalt-, iron-, or nickel aluminate], which acts to metallurgically bond the coating to the substrate. The coated product has a wear resistance substantially equivalent to aluminum oxide base cutting materials and a transverse rupture strength of at least 150,000, in most cases greater than 200,000 pounds/sq. inch. At very high cutting speeds, greater than about 1,500 surface ft./minute in some applications, possibly higher in others, the higher heat resistance of solid aluminum oxide may result in higher wear resistance. But in all cutting tests other than those above these levels, the wear resistance of the present coated products has proven to be substantially as high as aluminum oxide cutting materials.

While the broad range of coating thicknesses useful in the invention is from 1–20 microns, most coating thicknesses are preferably less than 15 microns. As will be shown in more detail below, certain applications require even narrower ranges within these limits, e.g. 1–3 microns has proven optimum for machining high temperature alloys and for milling applications; 6–12 microns has proven optimum for steel machining.

The process of the invention comprises passing an aluminum halide, water vapor and hydrogen gas over the carbide substrate at a temperature of from 900°–1250° C., the ratio of water vapor to the hydrogen gas being maintained between about 0.025 and 2.0, and preferably between 0.05 and 0.20.

There have previously been references in the literature of attempts or suggestions to coat a variety of substrates with aluminum oxide. However, insofar as is known, the coating of a cemented carbide substrate with aluminum oxide to produce a fully dense and adherent coating has never previously been disclosed. Nor has the unusual combination of properties exhibited by the present products been previously attainable in either coated or uncoated cutting tool materials. The products of the invention are remarkable in several respects. Their strength as compared with comparable known coated cemented carbide materials is considerably higher and their cutting performance is superior in terms of tool life at intermediate and higher cutting speeds. The basis for the foregoing statements will become apparent from the discussion and test results set forth below.

The term cemented carbide as used herein means one or more transitional carbides of a metal of Groups IVb, Vb, and VIb of the Periodic Table cemented or bonded by one or more matrix metals selected from the group iron, nickel and cobalt. A typical cemented carbide contains WC in a cobalt matrix or TiC in a nickel matrix.

Because of the demanding requirements normally placed upon a cemented carbide cutting material, the properties of any coating, the manner in which it is bonded to the substrate and its effect on substrate strength are extremely critical. The coating layer must have high integrity in terms of density and smoothness—porosity or nonuniformity cannot be tolerated. The coating must also be firmly and adherently bonded to the cemented carbide substrate to prevent spalling or separation in use. In addition, the coating must not reduce the strength of the cemented carbide substrate significantly. The products of the present invention have been extensively tested and have been found to satisfy all of the foregoing requirements. The coatings are uniform and fully dense, they are firmly bonded to the substrate and the coated composite retains a high proportion of its strength, usually greater than 85% of the transverse rupture strength of the uncoated substrate. The achievement of these characteristics in the coated product is believed to be quite unexpected, particularly in view of the substantial strength reductions known to result from the addition of wear-resistant coatings to cemented carbide substrates. The coated materials of the invention also produce a surface finish in machining operations which appears to be fully equivalent in quality to solid aluminum oxide cutting materials, the latter being known to produce the best surface finishes.

DESCRIPTION OF THE PREFERRED EMBODIMENTS

The outstanding properties of the aluminum oxide-coated product of the invention depend upon careful control of the process parameters. The process involves the use of a gaseous mixture of hydrogen, water, and an aluminum halide such as aluminum trichloride. Carbon monoxide and carbon dioxide may be optionally added. The primary overall deposition reaction is:

$$3H_2O + 2AlCl_3 \rightarrow Al_2O_3 + 6HCl$$

The most important ingredients in the gaseous reaction mixture are therefore water vapor and aluminum chloride vapor. However, the aluminum chloride vapor can be formed in several ways during the deposition reaction, as for example by heating solid $AlCl_3$ powder or by passing chlorine gas over aluminum metal. The water vapor is most conveniently formed by reacting hydrogen with carbon dioxide in the deposition chamber to form carbon monoxide and water vapor by the water gas reaction:

$$H_2 + CO_2 \rightleftharpoons CO + H_2O$$

The amount of water vapor formed in this manner depends upon the temperature and the initial concentrations of hydrogen, carbon dioxide, carbon monoxide and water vapor in the input gas stream. In order to form a good quality coating of desirable thickness in the temperature range of 900°-1250° C., the ratio of water to hydrogen gases present, after the water gas reaction, should be between about 0.025 and 2.0.

Hydrogen has been found to be necessary in the vapor deposition process to obtain a dense, adherent coating. Hydrogen appears to insure oxidation of the aluminum at the carbide surface. Oxidation in the reaction zone above the carbide substrate creates a condition known as dusting—which must be avoided. The absence of hydrogen creates a porous coating which is not fully dense. Thus the three necessary ingredients of the process are aluminum halide vapor, water vapor and hydrogen. In its preferred form, the process includes the use of aluminum chloride vapor, hydrogen and carbon dioxide, the latter reacting with $H_2$ to form water vapor.

The amount of water vapor present, after the reaction of known input concentrations of $H_2$ and $CO_2$ and CO and $H_2O$ if used, can be calculated using the following equation:

$$(H_2O)_f = \frac{-b + \sqrt{b^2 - 4ac}}{2a}$$

where $a = 1 - K$; $K$ = the equilibrium constant for the water gas reaction;

$b = (CO)_i - (H_2O)_i + K((H_2)_i + (CO_2)_i + 2(H_2O)_i)$; and

[$c = K((H_2)_i(CO_2)_i + (H_2)_i(H_2O)_i + (H_2O)_i(CO_2)_i + (-H_2O)_i^2)$] $c = -K((H_2)_i(CO_2)_i + (H_2)_i(H_2O)_i + (H_2O_i(-CO_2)_i + (H_2O)_i^2)$

The parentheses denote the concentration of the gaseous species enclosed within in terms of partial pressure, and the subscripts f and i denote the final or equilibrium concentrations and the initial or input concentrations, respectively. The amount of $H_2$ present, and thus the $H_2O/H_2$ ratio, can then be determined from the relationship:

$$(H_2)_f = (H_2)_i + (H_2O)_i - (H_2O)_f$$

A series of coated products were prepared in accordance with the invention by passing aluminum chloride vapor, hydrogen and carbon dioxide over cemented carbide inserts. The examples were prepared at various input gas compositions and at various final $H_2O/H_2$ concentrations. In all cases, deposition was at 1050° C. and a 45-minute deposition cycle was used with 2-3 grams of aluminum chloride and an aluminum chloride generator temperature of about 200° C. The use of more $AlCl_3$ shifts the desired $H_2O/H_2$ ratio to a higher value and vice versa. The coatings were deposited on a cemented carbide substrate having the following composition in percent by weight: WC-72, Co-8.5, TiC-8, TaC-11.5. Table I below shows the effect of gas composition on coating thickness. When coating with both higher and lower ratios of $H_2O/H_2$ (i.e. outside range of about 0.025 to 2.0), it wasn't possible to get a coating of sufficient thickness, i.e., >1 micron. Coating quality was good for all examples having more than 1 micron thickness coating. Coating quality was judged to be good if the coating could withstand an adherency test consisting of sliding the coated insert under a diamond brale indentor of the same type used for the Rockwell hardness test using a load of 2 kilograms on the diamond. If the coating resisted spalling or crumbling during this test, it was judged to have good quality. If it did not, it was judged to have poor quality.

TABLE I

| Example | Input gas partial pressures ($H_2$) | ($CO_2$) | (CO) | ($H_2O$) | Water gas reaction equilibrium partial pressures ($H_2$)+ | ($H_2O$)+ | $\frac{(H_2O)+}{(H_2)+}$ | Coating thickness (microns) |
|---|---|---|---|---|---|---|---|---|
| 1 | .978 | .022 | .000 | .000 | .956 | .0217 | .023 | <1 |
| 2 | .960 | .040 | .000 | .000 | .921 | .0391 | .043 | 2½ |
| 3 | .850 | .150 | .000 | .000 | .713 | .137 | .192 | 6 |
| 4 | .750 | .100 | .150 | .000 | .665 | .085 | .127 | 6 |
| 5 | .050 | *.100*[.850] | *.850*[.100] | .00 | .042 | .0085 | .205 | 3 |
| 6 | .600 | .400 | .000 | .000 | .323 | .277 | .857 | 3 |
| 7 | .450 | .250 | .300 | .000 | .307 | .143 | .466 | 9 |
| 8 | .400 | .600 | .000 | .000 | .123 | .277 | 2.26 | <1 |
| 9 | .100 | .700 | .200 | .000 | .019 | .081 | 4.26 | <1 |

TABLE I-continued

| Example | Input gas partial pressures ($H_2$) | ($CO_2$) | (CO) | ($H_2O$) | Water gas reaction equilibrium partial pressures ($H_2$)+ | ($H_2O$)+ | $\frac{(H_2O)+}{(H_2)+}$ | Coating thickness (microns) |
|---|---|---|---|---|---|---|---|---|
| 10 | .975 | .000 | .000 | .025 | .975 | .025 | .026 | 1 |

The nature of the coating obtained was determined by using X-ray diffraction analysis and optical microscopy. X-ray analyses showed the coating to be alpha $Al_2O_3$. At the higher deposition temperatures (greater than 1150° C.), significant amounts of the compound [$W_3CO_3C$] $W_3Co_3C$ began to form due to reaction of the substrate carbide with the coating atmosphere. Optical microscopy revealed a gray, translucent coating of $Al_2O_3$ that was fully dense and well bonded to the substrate in those examples in which the coating quality was found to be good. A very thin (less than 1 micron) layer of another nonmetallic compound [, cobalt aluminate ($CoAl_2O_4$),] *formed by oxidation of the titanium containing carbide phase of the substrate* (*a titanium containing oxide of the rutile-type* was present between the $Al_2O_3$ layer and the cemented carbide substrate. The presence of this thin layer is necessary to achieve the proper bond strength between the coating and the substrate, that is, a bond strength sufficient to pass the adherency test set forth above. In those cases in which no observable intermediate nonmetallic layer was present, the coated inserts did not pass the above described adherency test.

For this reason, [a cobalt (iron, or nickel) aluminate] intermediate layer is believed necessary to a good quality coating.

The preferred temperature range for deposition of the coating is 900° C. to 1250° C. At lower temperatures, the deposition rate becomes very low and the coating is poorly bonded to the substrate. At higher temperatures, excessive reaction occurs between the coating atmosphere and the cemented carbide substrate, weakening the bond between the coating and the substrate and lowering the strength of the overall composite body.

The strength of the $Al_2O_3$ coated cemented carbide composite was measured (as were all strength measurements disclosed herein), using a slightly modified standard transverse rupture test (ASTM No. B4066—63T), that included three roll loading and a span-to-thickness ratio of 3.5 to 1. Using a deposition temperature of 1050° C. and a cemented carbide substrate of the nature set forth in the first ten examples in Table I above, the average strength of bars having coating thicknesses of from 5–7 microns (the preferred thickness for this substrate in terms of wear resistance) was 241,000 p.s.i. This represents only a slight reduction (11%) from the 270,000 strength value obtained from the uncoated cemented carbide substrate.

In the following Table II, the metal cutting performance of coated inserts prepared in accordance with this invention is shown and compared with the corresponding performance of uncoated inserts. Examples 11 through 17 were ½"×½"×3/16" disposable cutting inserts, coated with $Al_2O_3$ [at 1050° C.] by the vapor deposition technique disclosed above for Examples 1 through 10. A range of coating thicknesses of from 1–10 microns was used. These inserts were then used to machine SAE 1045 steel, 190 BHN hardness, at 700–1000- and 1500-surface-feet-per-minute speeds, .010 inch per revolution feed, and .100 inch depth of cut. The cutting times to a flank wear of .010 inch are shown in Table II, along with the crater wear depth at the .010 flank wear time. The transverse rupture strengths are also given. For comparison purposes, the cutting performance and strengths of the uncoated substrate material, Examples 18 and 19, a commercially available solid aluminum oxide base (89% $Al_2O_3$, 11% TiO) insert—Examples 20–22—and a TiC coated cemented carbide insert—all run under the same conditions—is also shown in Table II.

TABLE II

| Example | | Coating thickness (microns) | Cutting speed, s.f.p.m. | Time to .010 flank wear (min) | Crater depth at .010 flank wear | Transverse rupture strength (p.s.i.) |
|---|---|---|---|---|---|---|
| 11 | $Al_2O_3$ coating on cemented carbide[1] | 1 | 700 | 9 | .003" | 260,000 |
| 12 | $Al_2O_3$ coating on cemented carbide[1] | 4 | 700 | 32 | .002" | 250,000 |
| 13 | $Al_2O_3$ coating on cemented carbide[1] | 7 | 700 | 51 | .001" | 235,000 |
| 14 | $Al_2O_3$ coating on cemented carbide[1] | 10 | 700 | 51 | .008" | 210,000 |
| 15 | $Al_2O_3$ coating on cemented carbide[1] | 7 | 1,500 | [2]4.2 | [3].0003" | 235,000 |
| 16 | $Al_2O_3$ coating on cemented carbide[4] | 7 | 1,000 | 17 | .007" | 175,000 |
| 17 | $Al_2O_3$ coating on cemented carbide[4] | 12 | 1,000 | 26 | .003" | 160,000 |
| 18 | Uncoated carbide[1] | | 700 | 4 | .004" | 270,000 |
| 19 | Uncoated carbide[1] | | 1,000 | 5 | .010" | 230,000 |
| 20 | Solid $Al_2O_1$ | | 700 | 51 | .001" | 90,000 |
| 21 | Solid $Al_2O_1$ | | 1,000 | 30 | .002" | 90,000 |
| 22 | Solid $Al_2O_1$ | | 1,500 | [2]4.5 | [3].0002" | 90,000 |
| 23 | TiC coating on cemented carbide[1] | 5 | 700 | 18 | .011" | 175,000 |
| 24 | TiC coating on cemented carbide[1] | 5 | 1,000 | 4 | .011" | 175,000 |

[1]72% WC, 8% Tic, 11.5% TaC, 8.5% Co.
[2]To .004" wear.
[3]At .004" flank wear.
[5]71% WC, 12.5% TiC, 12% TaC, 4.5% Co.

It can be seen that the cutting performance of the cemented carbide tool material is very substantially improved by the $Al_2O_3$ coating and that this improvement is substantially greater than a TiC coating on the same substrate. It is also evident that the amount of improvement obtained is dependent upon coating thickness up to a value of about 7 microns and that some evidence of performance decline occurs at 10 microns. At the optimum thickness value of 7 microns for this substrate, the performance of the $Al_2O_3$ coated tool was equivalent to that of the solid $Al_2O_3$ tool at all three speeds tested. The strength of the $Al_2O_3$ coated inserts was, however, considerably higher than solid $Al_2O_3$ and higher than the strength of the same substrate with a TiC coating.

It should be noted that, because of strength limitations, it has not been feasible to use solid aluminum oxide cutting materials in disposable cutting inserts of the type used in pin-type holders. These inserts have a centrally disposed hole for the reception of a pin which locks the insert in place. The strength of such inserts must be sufficient to resist the locking stresses. The strength of the present coated materials is sufficiently high to enable their use in such inserts. The present invention therefore makes possible the use of an insert, in such applications, having a higher wear resistance than any comparable insert presently available.

The following Table III shows the performance of the coated inserts of the invention in cutting a high temperature nickel-base alloy, specifically Inconel 718 in the solution-aged condition (BHN 390 hardness). The results, Example 25, are compared with the performance of an uncoated cemented carbide of the same composition (Example 26), and in addition with a commercial solid aluminum oxide tool (Example 27). The inserts were of the negative-rake disposable type (indexable and invertible) and were $\frac{1}{2}'' \times \frac{1}{2}'' \times 3/16''$. The cemented carbide substrate for Examples 25 and 26 was 94% WC and 6% Co. The substrate was coated with $Al_2O_3$ [at 1050° C.] by vapor deposition process described above in connection with Examples 1 through 10.

TABLE III

| Example | Insert type | Coating thickness (microns) | Time to .020" flank wear (min.) | Comments |
|---|---|---|---|---|
| 25 | $Al_2O_3$ coating on cemented carbide | 2.5 | 8.5 | |
| 26 | Uncoated cemented carbide | | 5.4 | |
| 27 | Solid $Al_2O_3$ | | <1 | Rapid edge breakdown. |

The performance of the insert coated with 2.5 microns of $Al_2O_3$ was significantly better than that of the uncoated cemented carbide insert of the same substrate composition. From tests with other coating thicknesses, it has been determined that the optimum thickness for this kind of machining (i.e., high temperature alloys) is in the 1-3 micron range. Thicknesses greater than 3 microns in these tests decreased tool life. The superior strength of the $Al_2O_3$ coated tools is amply demonstrated by the rapid failure of the solid $Al_2O_3$ tool in Example 27, whereas no breakage or chipping was observed in the $Al_2O_3$ coated tools, Examples 25.

The foregoing is a description of illustrative embodiments of the invention, and it is applicant's intention in the appended claims to cover all forms which fall within the scope of the invention.

I claim:

[1. A high-strength, high-wear-resistance coated cemented carbide product comprising a cemented carbide substrate and a fully dense alpha aluminum oxide coating of from 1-20 microns thickness firmly and adherently bonded to said cemented carbide substrate through an intermediate layer of an iron group metal aluminate said coated cemented carbide product having a wear resistance substantially equivalent to aluminum oxide base cutting materials and having a transverse rupture strength of at least 150,000 p.s.i.]

[2. The coated cemented carbide product of claim 1 in which the cemented carbide substrate comprises tungsten carbide and a cobalt matrix.]

[3. The coated cemented carbide product of claim 2 in which the intermediate layer is cobalt aluminate.]

[4. The coated cemented carbide product of claim 1 in the form of a disposable cutting insert for the machining of metal and other materials.]

[5. The coated cemented carbide insert of claim 4 having a centrally disposed hole therein, the insert adapted to be mounted in a pin-type toolholder.]

[6. The coated cemented carbide product of claim 1 in which the coating is less than 15 microns in thickness.]

[7. The coated cemented carbide product of claim 1 in which the cemented carbide substrate comprises titanium carbide and a matrix selected from the group consisting of iron, nickel and cobalt.]

[8. The coated cemented carbide product of claim 7 containing tantalum carbide.]

[9. The coated cemented carbide product of claim 1 in which the cemented carbide substrate comprises tungsten carbide, titanium carbide and tantalum carbide and a cobalt matrix.]

*10. A cemented carbide tool provided with a surface coating produced by coating at least a portion of the surface of the cemented carbide with a layer 1.0 to 20 microns thick of refractory aluminum oxide.*

*11. A cemented carbide tool as claimed in claim 10 wherein said surface coating has a thickness of between 1.0 and 10 microns.*

*12. A cemented carbide tool as claimed in claim 10 wherein said cemented carbide is composed of a carbide of a metal selected from the group consisting of tungsten, titanium, tantalum and niobium, or a mixed carbide of tantalum and niobium, and a binder metal selected from the group consisting of cobalt, iron, and nickel.*

* * * * *